(12) United States Patent
Aoyama

(10) Patent No.: US 8,174,079 B2
(45) Date of Patent: May 8, 2012

(54) SEMICONDUCTOR DEVICE HAVING A SILICIDE GATE ELECTRODE

(75) Inventor: Tomonori Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/926,430

(22) Filed: Nov. 17, 2010

(65) Prior Publication Data

US 2011/0062528 A1 Mar. 17, 2011

Related U.S. Application Data

(62) Division of application No. 11/600,794, filed on Nov. 17, 2006, now Pat. No. 7,858,524.

(30) Foreign Application Priority Data

Nov. 30, 2005 (JP) ................................. 2005-346464

(51) Int. Cl.
*H01L 27/092* (2006.01)
(52) U.S. Cl. ............ 257/369; 257/E27.06; 257/E27.081
(58) Field of Classification Search ................... 257/369, 257/E27.06, E27.081
See application file for complete search history.

(56) References Cited

U.S. PATENT DOCUMENTS

| | | | | |
|---|---|---|---|---|
| 6,455,900 B2 * | 9/2002 | Susami | ........................ | 257/369 |
| 6,909,156 B2 | 6/2005 | Aoyama | | |
| 7,151,023 B1 * | 12/2006 | Nayfeh et al. | ................ | 438/231 |
| 7,479,683 B2 * | 1/2009 | Bojarczuk et al. | ............ | 257/410 |
| 2004/0084734 A1 | 5/2004 | Matsuo | | |
| 2005/0199963 A1 | 9/2005 | Aoyama | | |
| 2005/0245016 A1 * | 11/2005 | Pan et al. | ...................... | 438/199 |
| 2005/0285206 A1 | 12/2005 | Kadoshima et al. | | |
| 2007/0228458 A1 * | 10/2007 | Henson et al. | ................ | 257/327 |

FOREIGN PATENT DOCUMENTS

JP 2006-344836 12/2006
WO WO 2006/137371 A1 12/2006

OTHER PUBLICATIONS

Terai et al. "Highly Reliable HfSiON CMOSFET with Phase Controlled NiSi (NFET) and Ni3Si (PFET) FUSI Gate Electrode." Jun. 14-16, 2005, Symposium on VLSI Technology Digest of Technical Papers, IEEExplore, pp. 68-69.*
Takahashi et al., "Dual Workfunction Ni-Silicide/HfSiON Gate Stacks by Phase-Controlled Full-Silicidation (PC-FUSI) Technique for 45 nm-node LSTO and LP Devices," IEDM Technical Digest (2004), pp. 91-94.
Aoyama et al., "Proposal of New HfSiON CMOS Fabrication Process (HAMDAMA) for Low Standby Power Device," IEDM Technical Digest (2004), pp. 95-98.
Kedzierski et al., Threshold voltage control in NiSi-gated MOSFETs through silicidation induced impurity segregation (SIIS), IEDM Tech Dig. 315 (2003), 4 pages.

(Continued)

*Primary Examiner* — Wensing Kuo
(74) *Attorney, Agent, or Firm* — Finnegan, Henderson, Farabow, Garrett & Dunner, L.L.P.

(57) ABSTRACT

A semiconductor device includes a semiconductor substrate; a gate insulation film formed on the semiconductor substrate; a silicide gate electrode of an n-type MISFET formed on the gate insulation film; and a silicide gate electrode of a p-type MISFET formed on the gate insulation film and having a thickness smaller than that of the silicide gate electrode of the n-type MISFET, the silicide gate electrode of the p-type MISFET having a ratio of metal content higher than that of the silicide gate electrode of the n-type MISFET.

3 Claims, 25 Drawing Sheets

OTHER PUBLICATIONS

Kedzierski et al., "Metal-gate Fin FET and fully-depleted SOI devices using total gate silicidation," IEDM Tech Dig. 247 (2002), 4 pages.

"Notification of Reasons for Rejection" issued in copending Japanese patent application No. 2005-346464, mailed on Jan. 7, 2011, and English-language translation thereof.

* cited by examiner

SEMICONDUCTOR DEVICE HAVING A SILICIDE GATE ELECTRODE

CROSS-REFERENCE TO RELATED APPLICATION

This is a division of application Ser. No. 11/600,794, filed Nov. 17, 2006 now U.S. Pat. No. 7,858,524, which is incorporated herein by reference.

This application is based upon and claims the benefit of priority from the prior Japanese Patent Applications No. 2005-346464, filed on Nov. 30, 2005, the entire contents of which are incorporated herein by reference.

BACKGROUND OF THE INVENTION

1. Field of the Invention

The present invention relates to a semiconductor device and a semiconductor device manufacturing method.

2. Related Art

In a case that a polysilicon gate electrode is used, the gate electrode is liable to be depleted when a voltage is applied to the gate electrode. The depleted gate electrode is disadvantageous in that an inverting capacity of a channel region is reduced. A metal gate electrode is employed to suppress the depletion of the gate electrode. A full silicide gate electrode is developed as a kind of the metal gate electrode. The full silicide gate electrode is a gate electrode silicided by reacting an overall polysilicon gate with a metal such as nickel and the like.

Further, recently, as a gate dielectric film is increasingly reduced in thickness and the dielectric constant thereof is more increased, it is contemplated to use a high dielectric material such as HfSiON, $HfO_2$, and the like as the gate insulation film. When the high dielectric material is used as the gate insulation film, a threshold voltage of a p-type MISFET (Metal-Insulator Semiconductor Field-Effect Transistor) greatly shifts to a negative side. The change of the threshold voltage is observed even if the full silicide gate electrode is employed.

Heretofore, a large amount of an impurity is implanted in a gate electrode to suppress change of the threshold voltage of the p-type MISFET and to employ the full silicide gate electrode (Kedzierski et al. IEDM Tech. Dig. 247(2002) and Kedzierski et al IEDM Tech. Dig. 315(2003)). However, when a large amount of dopant is implanted, a p-type impurity (in particular, boron) penetrates to a semiconductor substrate, from which a problem arises in that the threshold voltage disperses and a carrier mobility is deteriorated.

In contrast, when a metal rich silicide, which contains a metal in an amount larger than that of an n-type MISFET, is used as a gate electrode of a p-type MISFET, the threshold voltage of the p-type MISFET is set to a proper value even if a gate insulation film is composed of a high dielectric material (Takahashi et al. IEDM Tech. Dig. 91(2004)). However, when the same metal rich silicide is applied to a gate electrode of an n-type MISFET, a problem arises in that a threshold voltage of the n-type MISFET shifts from a proper value.

SUMMARY OF THE INVENTION

A semiconductor device manufacturing method according to an embodiment of the present invention comprises forming a gate insulation film on a semiconductor substrate; depositing a gate electrode material on the gate insulation film; depositing a mask material on the gate electrode material; shaping the mask material into a gate electrode pattern; processing the gate electrode material into the gate electrode pattern using the shaped mask material as a mask; forming a spacer on the side surface of the processed gate electrode material; depositing an interlayer insulation film on the gate electrode material and on the semiconductor substrate; polishing the interlayer insulation film until the upper surface of the mask material is exposed; exposing the upper surface of the gate electrode material in a p-type MISFET forming-region by selectively removing the mask material in the p-type MISFET forming-region; depositing a first metal film on the gate electrode material in the p-type MISFET forming-region; siliciding the gate electrode material in the p-type MISFET forming-region by reacting the gate electrode material with the first metal film (a first silicidation); exposing the upper surface of the gate electrode material in an n-type MISFET forming-region by removing the mask material in the n-type MISFET forming-region; depositing a second metal film on the respective gate electrode materials of a p-type MISFET and an n-type MISFET; and siliciding the respective gate electrode materials in the p-type MISFET and the n-type MISFET by reacting the respective gate electrode materials with the second metal film (a second silicidation).

A semiconductor device manufacturing method according to an embodiment of the invention comprises forming a gate insulation film on a semiconductor substrate; depositing a gate electrode material on the gate insulation film; depositing a mask material on the gate electrode material; shaping the mask material into a gate electrode pattern; processing the gate electrode material into the gate electrode pattern using the shaped mask material as a mask; forming a spacer on the side surface of the processed gate electrode material; depositing an interlayer insulation film on the gate electrode material and on the semiconductor substrate; polishing the interlayer insulation film until the upper surface of the mask material is exposed; exposing the upper surface of the gate electrode material in a p-type MISFET forming-region by selectively removing the mask material in the p-type MISFET forming-region; etching an upper potion of the gate electrode of the p-type MISFET forming-region; exposing the upper surface of the gate electrode material in an n-type MISFET forming-region by removing the mask material in the n-type MISFET forming-region; depositing a metal film on the respective gate electrode materials of a p-type MISFET and an n-type MISFET; and siliciding the respective gate electrode materials in the p-type MISFET and the n-type MISFET by reacting the respective gate electrode materials with the metal film.

A semiconductor device according to an embodiment of the present invention comprises a semiconductor substrate; a gate insulation film formed on the semiconductor substrate; a silicide gate electrode of an n-type MISFET formed on the gate insulation film; and a silicide gate electrode of a p-type MISFET formed on the gate insulation film and having a thickness smaller than that of the silicide gate electrode of the n-type MISFET, the silicide gate electrode of the p-type MISFET having a ratio of metal content higher than that of the silicide gate electrode of the n-type MISFET.

DETAILED DESCRIPTION OF THE INVENTION

Embodiments according to the present invention will be described below with reference to the drawings. These embodiments by no means restrict the present invention.

First Embodiment

FIGS. 1 to 21 are sectional views showing a flow of a semiconductor device manufacturing method according to a first embodiment of the present invention. First, trenches are formed to a silicon substrate 101, and STIs (Shallow Trench Isolations) 102 are formed by burying a silicon oxide film in the trench. A sacrifice oxide film 103 is formed on a surface of the silicon substrate 101.

Figure 1:
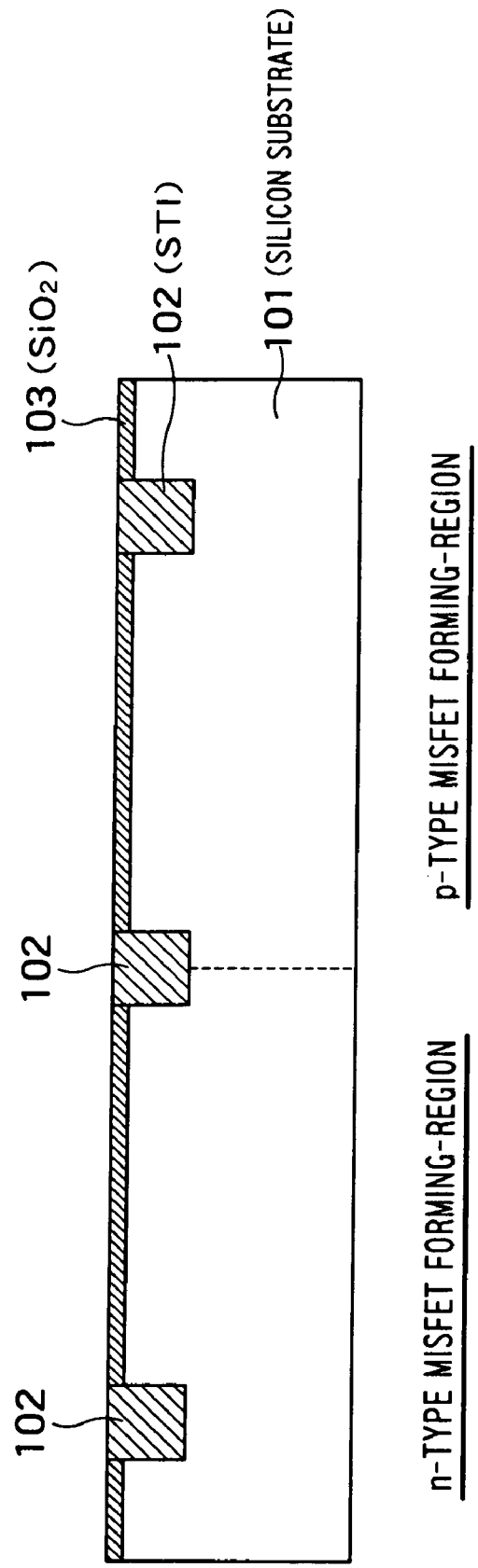
FIG. 1 is a sectional view showing a flow of a semiconductor device manufacturing method according to a first embodiment.
Figure 2:
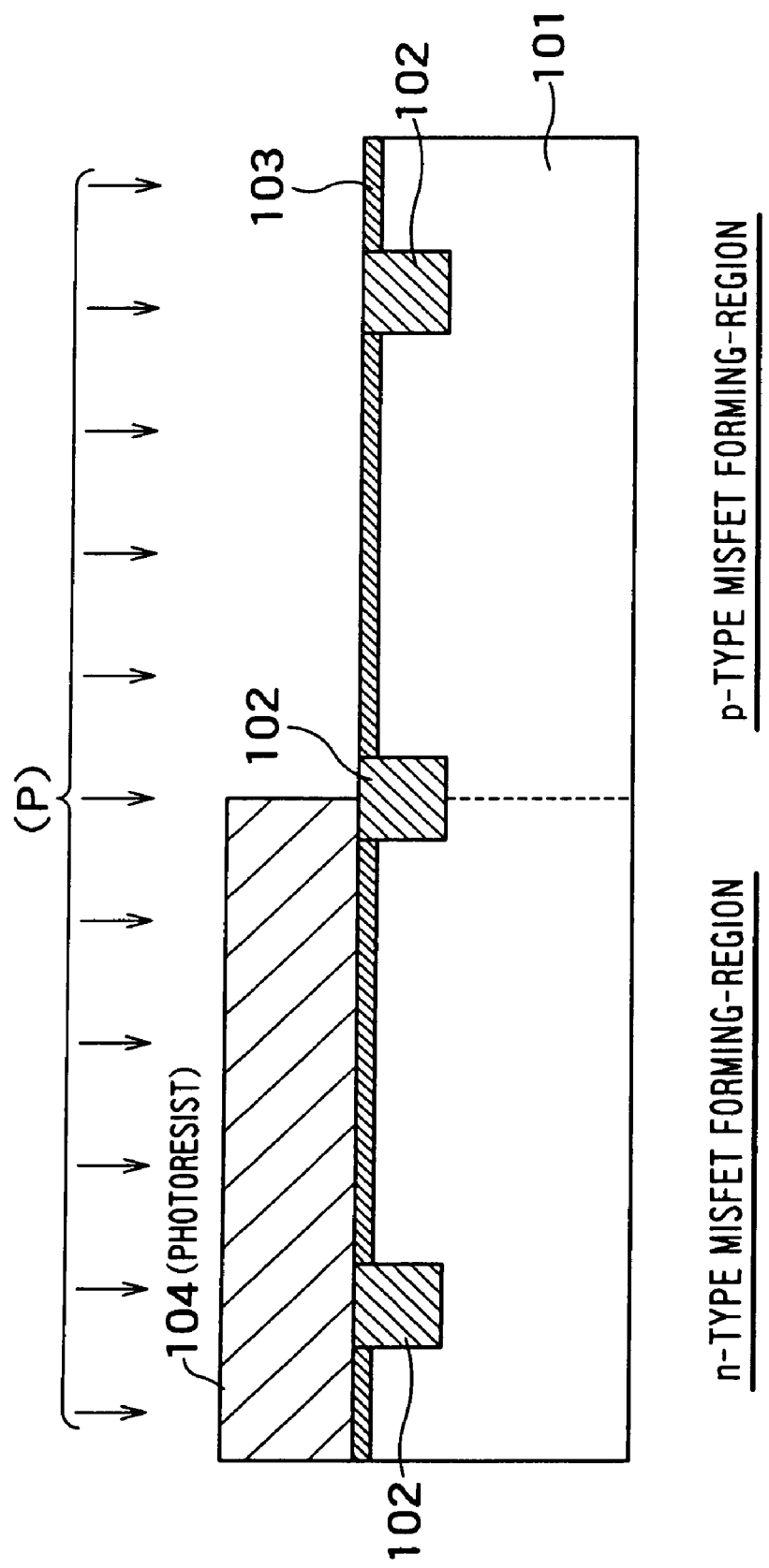
FIG. 2 is a sectional view showing a flow of a semiconductor device manufacturing method following FIG. 1.
Figure 3:
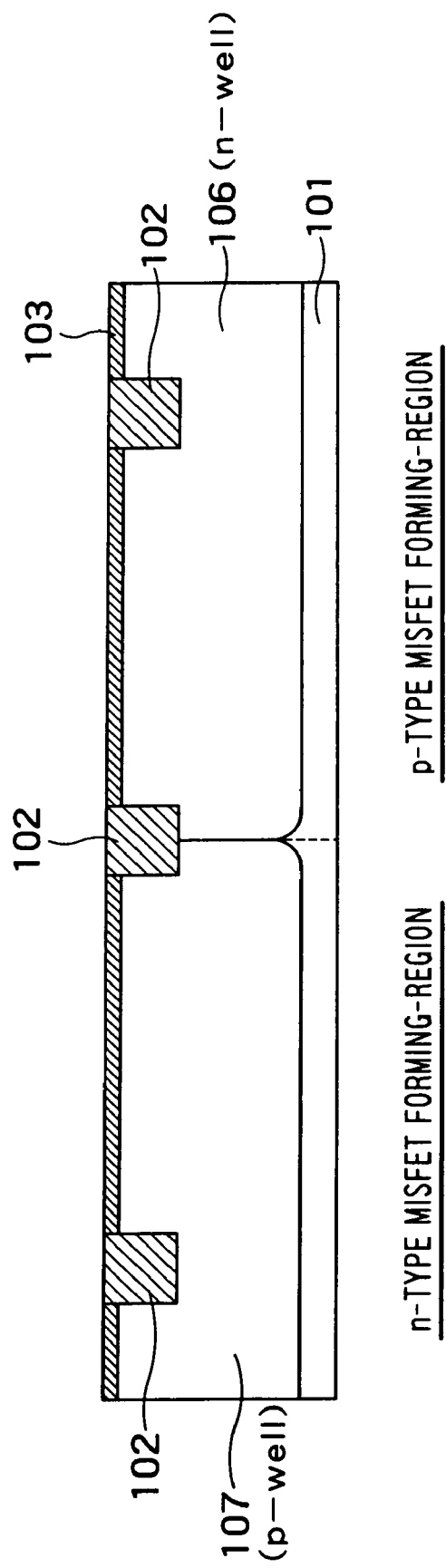
FIG. 3 is a sectional view showing a flow of a semiconductor device manufacturing method following FIG. 2.
Figure 4:
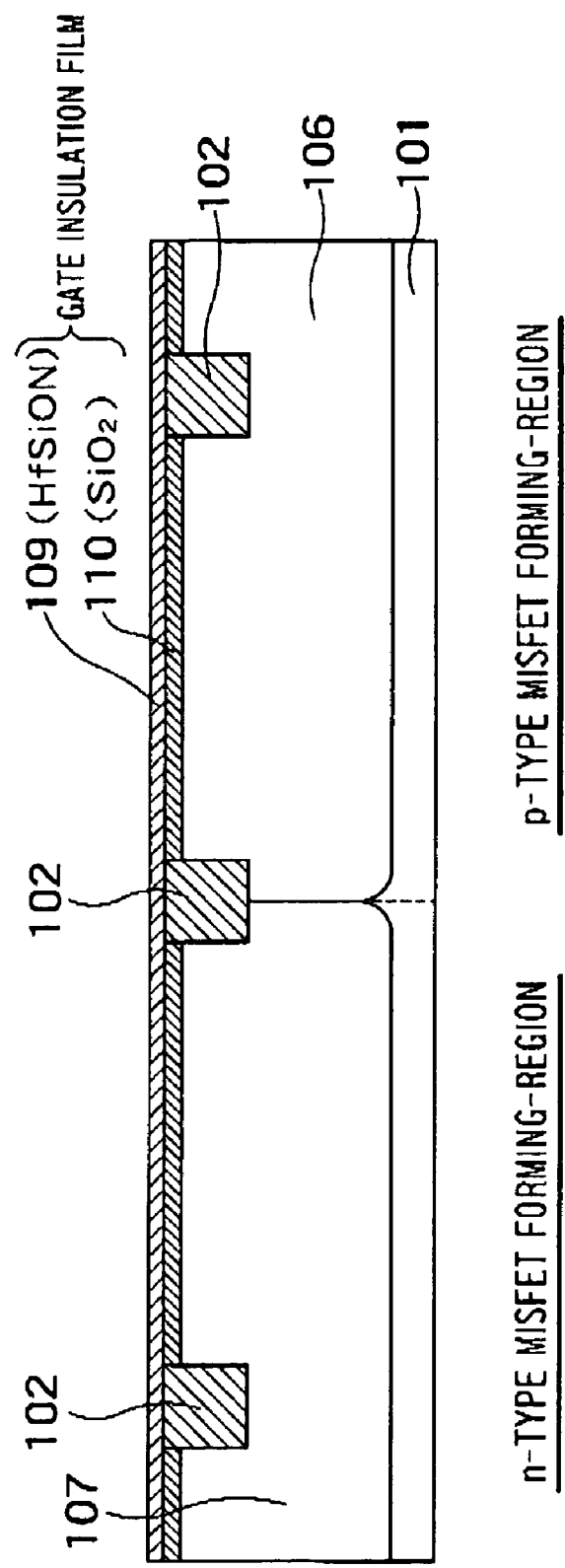
FIG. 4 is a sectional view showing a flow of a semiconductor device manufacturing method following FIG. 3.

Next, as shown in FIG. 2, an n-type MISFET (Metal-Insulator Semiconductor Field-Effect Transistor) forming-region is covered with a photoresist 104. To form an n-type well, an n-type impurity (for example, phosphorus) is ion implanted in a p-type MISFET forming-region. Note that phosphorus is also implanted to adjust a threshold voltage of a transistor in addition to formation of a diffusion layer and the like. Although not shown, the p-type MISFET forming-region is covered with a photoresist and a p-type impurity (for example, boron) is implanted in the n-type MISFET forming-region likewise to form a p-type well. Subsequently, as shown in FIG. 3, the n-type well 106 and the p-type well 107 are formed by thermally diffusing these impurities.

The sacrifice oxide film 103 is removed using a $NH_4F$ aqueous solution. Just after the surfaces of the wells 106, 107 are rinsed with 0.5 to 5% dilute hydrofluoric acid, an about 0.5 nm thick silicon oxide film 110 is formed, and further a 2.0 nm thick hafnium silicate (HfSiO) film is formed on the silicon substrate 101 using tetrakis(diethylamino)hafnium, diethyl silane, and oxygen.

Next, after the HfSiO film is made dense by a heat treatment, it is subjected to a heat treatment in a nitride plasma atmosphere or in an $NH_3$ atmosphere and modified the HfSiO film to a hafnium silicon oxynitride (HfSiON) film 109. With these processes, a structure shown in FIG. 4 can be obtained. The HfSiON film 109 and the silicon oxide film 110 act as a gate insulation film.

Figure 5:
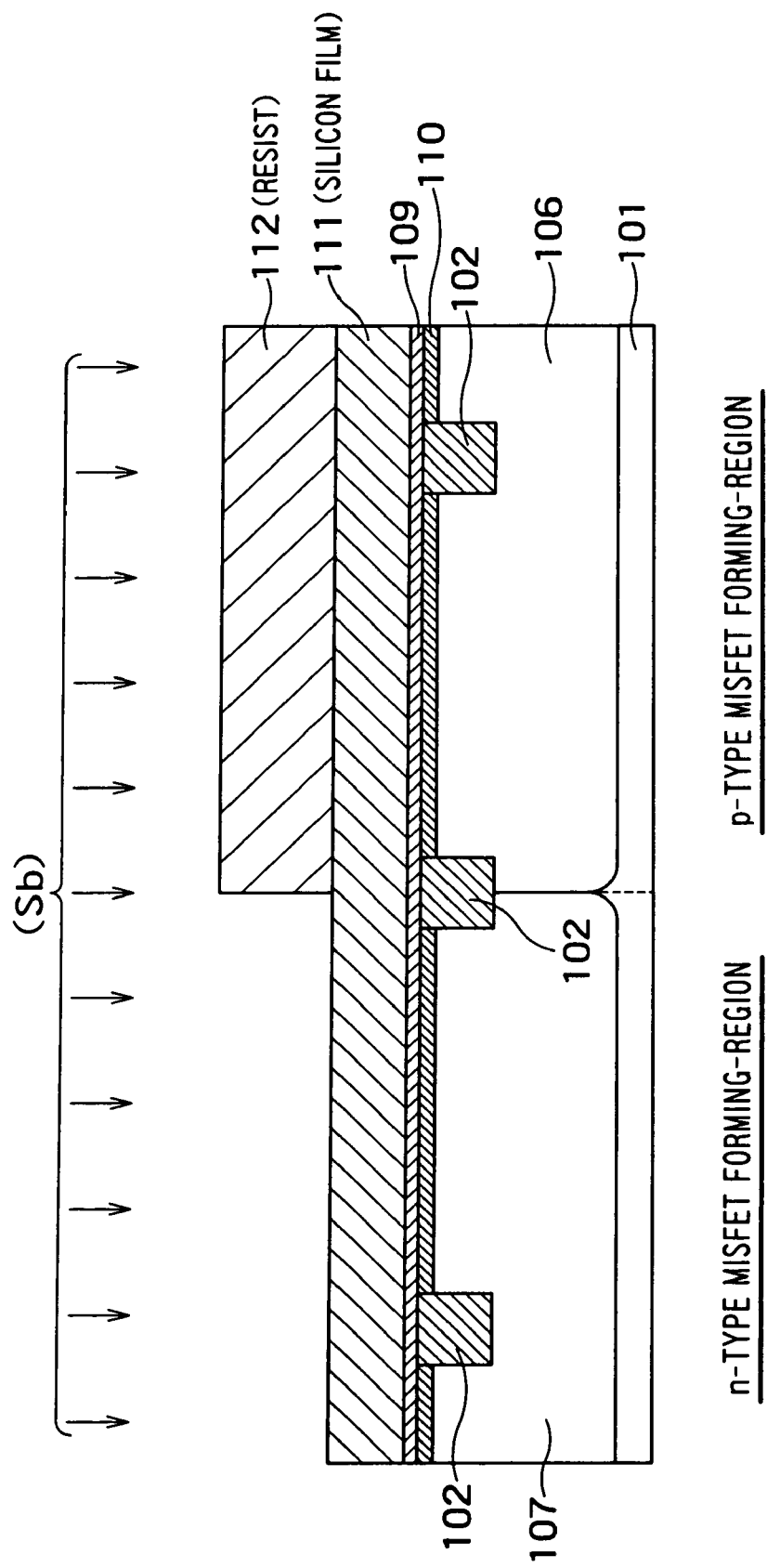
FIG. 5 is a sectional view showing a flow of a semiconductor device manufacturing method following FIG. 4.

Next, an amorphous silicon film or a polycrystal silicon film 111 (hereinafter, referred to as silicon film 111) is deposited on the HfSiON film 109 as a gate electrode material by using a CVD (Chemical Vapor Deposition) process. Subsequently, as shown in FIG. 5, the p-type MISFET forming-region is covered with a photoresist 112, and an n-type impurity (for example, antimony Sb) is ion implanted into the silicon film 111 on the n-type MISFET forming region.

Figure 6:
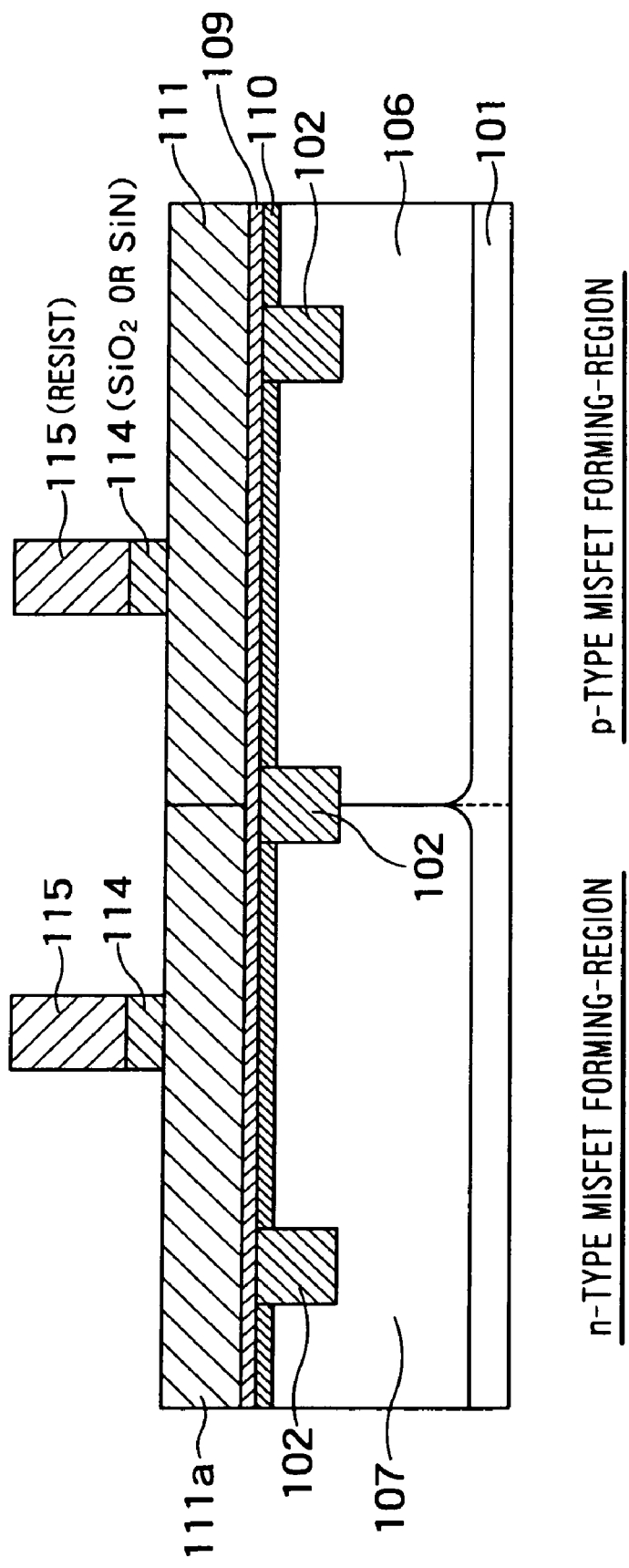
FIG. 6 is a sectional view showing a flow of a semiconductor device manufacturing method following FIG. 5.

Next, a silicon oxide film or a silicon nitride film (hereinafter, referred to as mask material) 114 is deposited on the silicon film 111 as a mask material. Subsequently, as shown in FIG. 6, the mask material 114 is formed to a gate electrode pattern by using photolithography.

Figure 7:
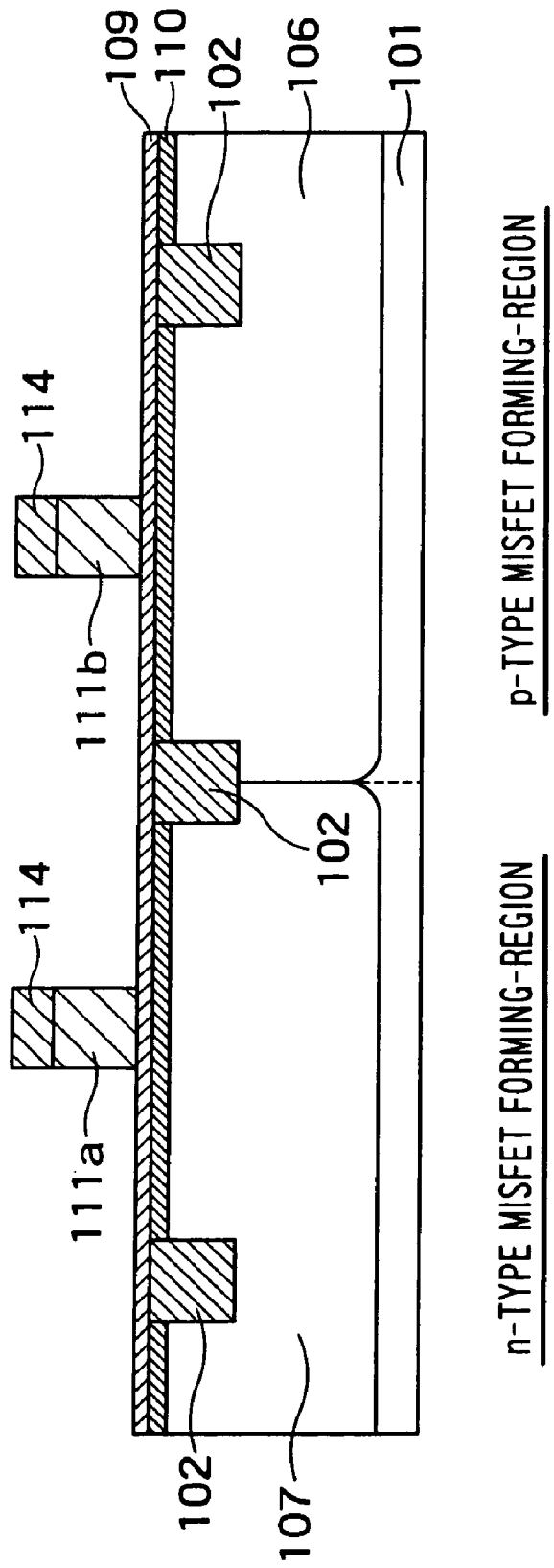
FIG. 7 is a sectional view showing a flow of a semiconductor device manufacturing method following FIG. 6.
Figure 8:
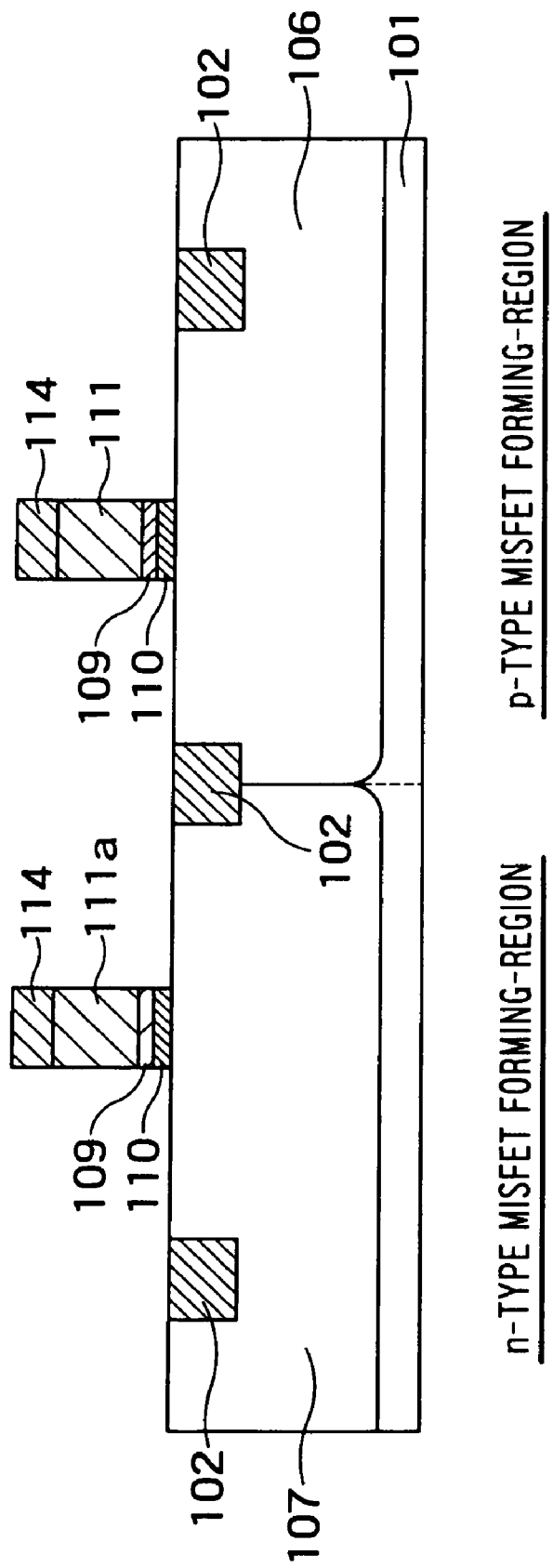
FIG. 8 is a sectional view showing a flow of a semiconductor device manufacturing method following FIG. 7.

After a resist 115 is removed, the silicon film 111 is processed to an electrode pattern by using the mask material 114 as a hard mask as shown in FIG. 7. At the time, although an n-type impurity is implanted in a gate electrode 111a of an n-type MISFET, no impurity is implanted in a gate electrode 111b of a p-type MISFET.

Thereafter, the HfSiON film 109 is removed with dilute hydrofluoric acid or the like while remaining the HfSiON film 109 under the gate electrodes 111a, 111b. At the time, a hydrofluoric acid concentration and an etching time are adjusted so that the mask material 114 is not entirely etched. In addition, the hydrofluoric acid concentration and the etching time also depend on a type and a thickness of a high-dielectric (high-K) insulation film. For example, it is preferable to set the hydrofluoric acid concentration to 1% or less and the etching time to 300 seconds or less. Note that since the silicon oxide film 110 has a very thin thickness of about 0.5 nm, it is ordinarily removed when the HfSiON film 109 is etched. However, no problem arises even if the silicon oxide film 110 remains on the surface of the silicon substrate 101.

Figure 9:
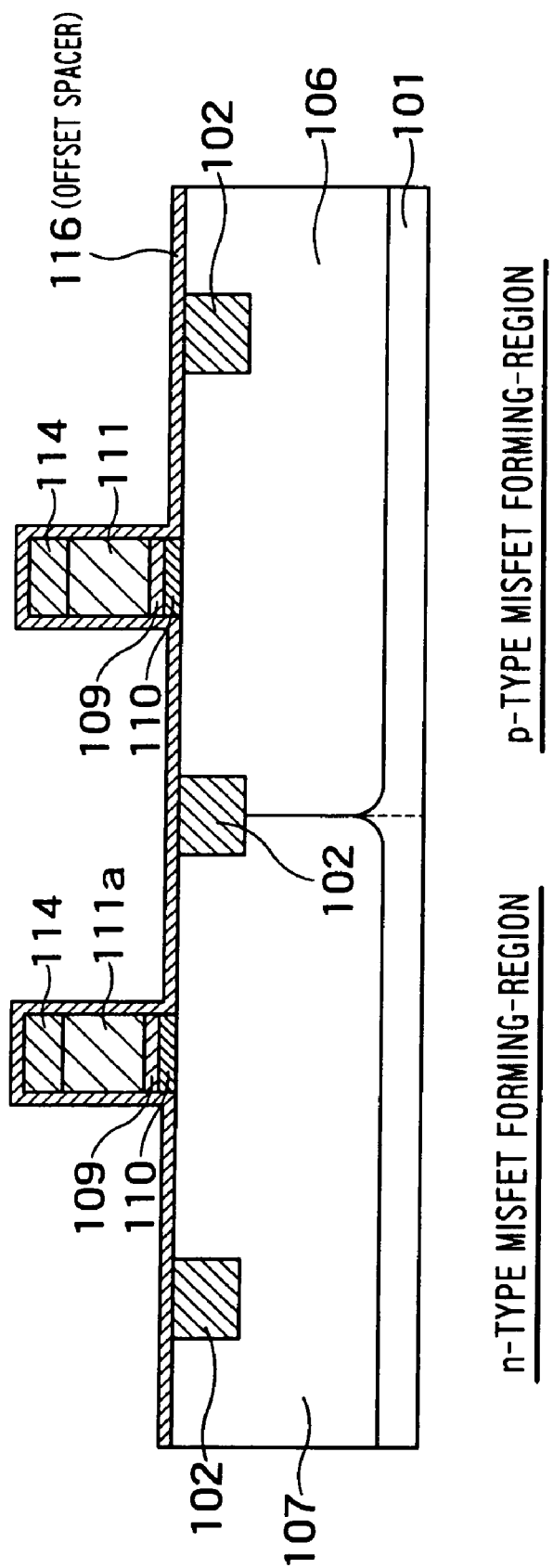
FIG. 9 is a sectional view showing a flow of a semiconductor device manufacturing method following FIG. 8.

Next, the side surfaces of the gate electrodes 111a, 111b and the surface of the silicon substrate 101 are slightly oxidized. At the time, the oxidation treatment is carried out at 1000° C. for about 5 seconds in an atmosphere containing 0.2% of oxygen. The thickness of the oxide film formed by the treatment is about 2 nm. Thereafter, as shown in FIG. 9, an offset spacer 116 formed of a silicon oxide film or a silicon nitride film is formed using a CVD process.

Figure 10:
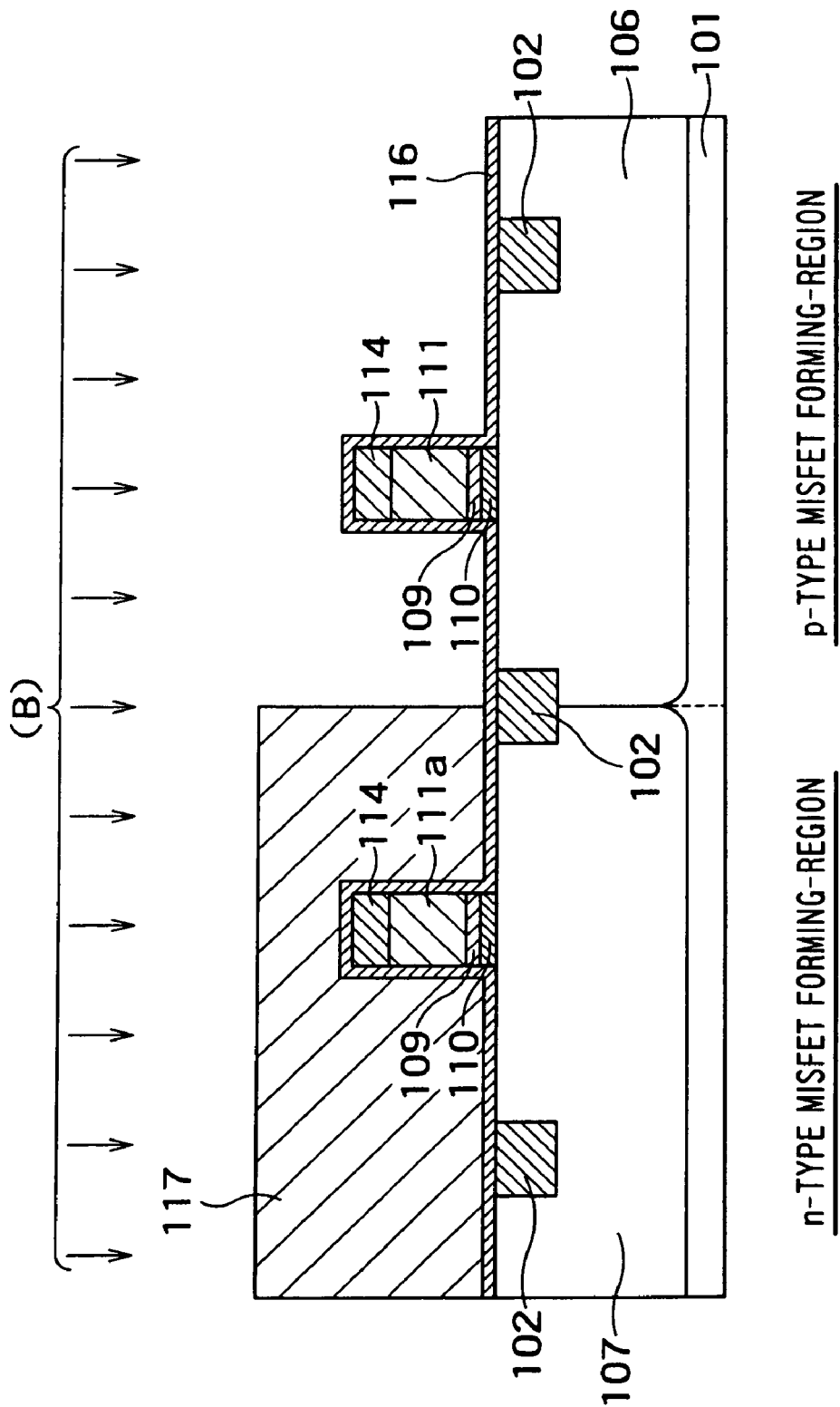
FIG. 10 is a sectional view showing a flow of a semiconductor device manufacturing method following FIG. 9.

As shown in FIG. 10, the n-type MISFET forming-region is covered with a photoresist 117 using photolithography, and a p-type impurity (for example, boron) is ion implanted in the p-type MISFET forming-region. Although not shown, the p-type MISFET forming region is covered with a photoresist, and an n-type impurity (for example, phosphorus or arsenic) is ion implanted in the n-type MISFET forming-region likewise.

Figure 11:
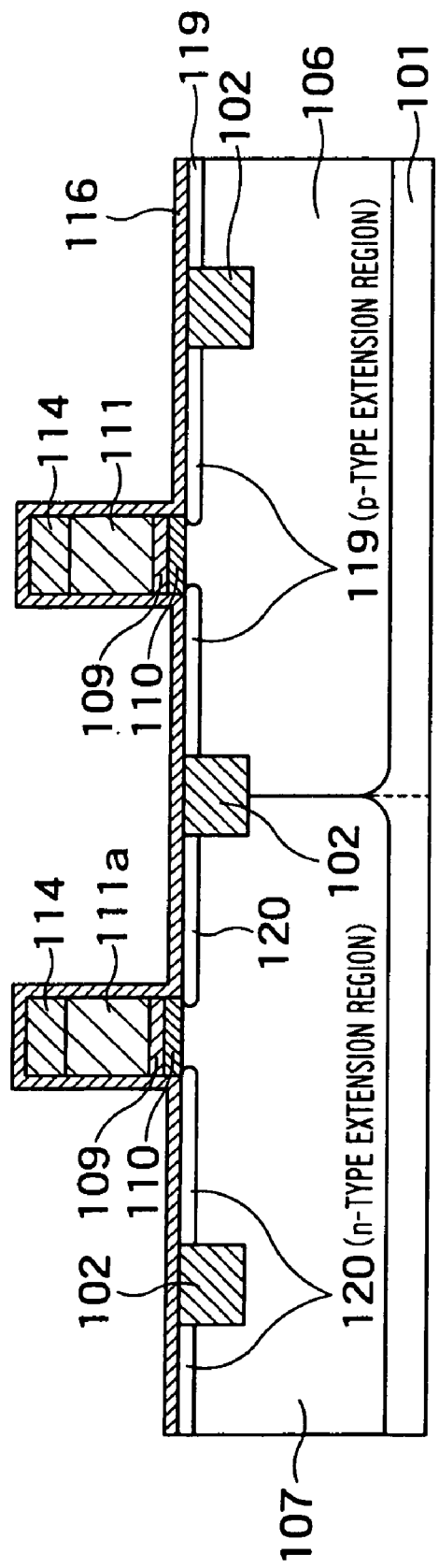
FIG. 11 is a sectional view showing a flow of a semiconductor device manufacturing method following FIG. 10.

After the photoresist is removed, the silicon substrate 101 is subjected to a heat treatment and the impurities are activated, thereby a p-type extension region 119 and an n-type extension region 120 are formed as shown in FIG. 11.

Figure 12:
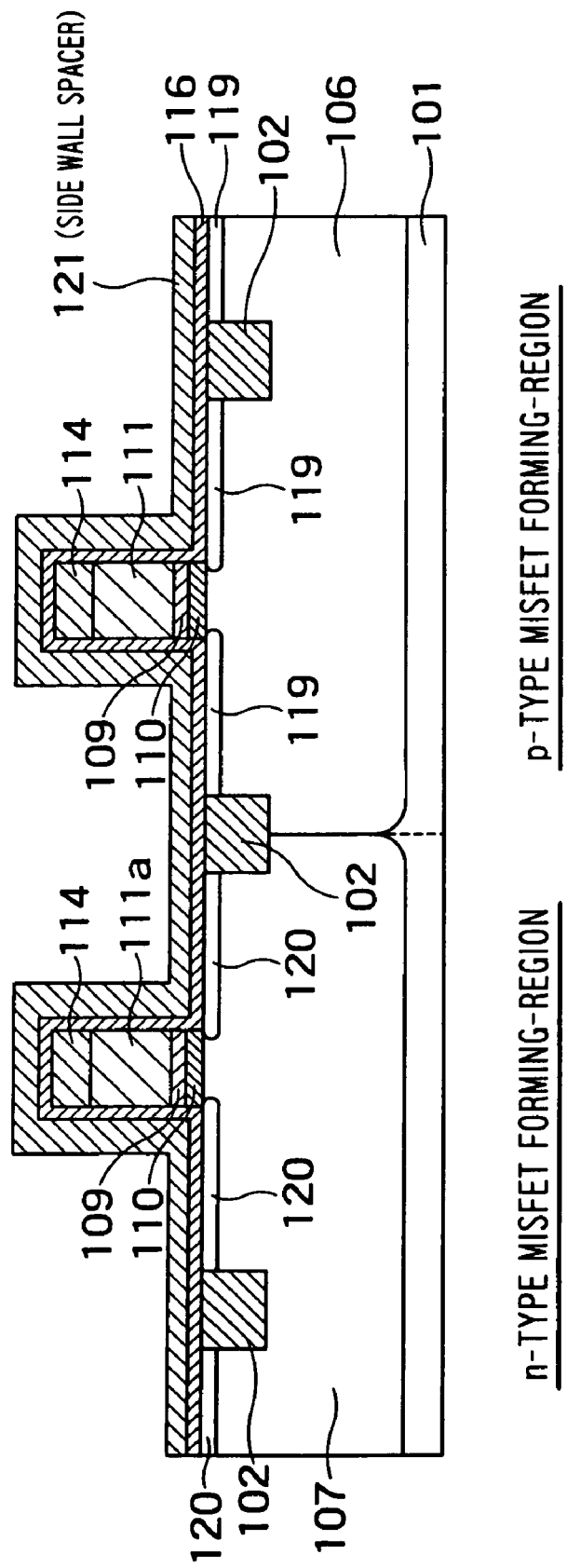
FIG. 12 is a sectional view showing a flow of a semiconductor device manufacturing method following FIG. 11.

Next, as shown in FIG. 12, a side wall spacer 121 composed of a silicon nitride film is deposited on the gate electrode materials 111a, 111b and the silicon substrate 101 by using a CVD process. Thereafter, the side wall spacer 121 is anisotropically etched using RIE (Reactive Ion Etching). With this treatment, the offset spacer 116 and the side wall spacer 121 are remained on the side surfaces of the gate electrode materials 111a, 111b.

Figure 13:
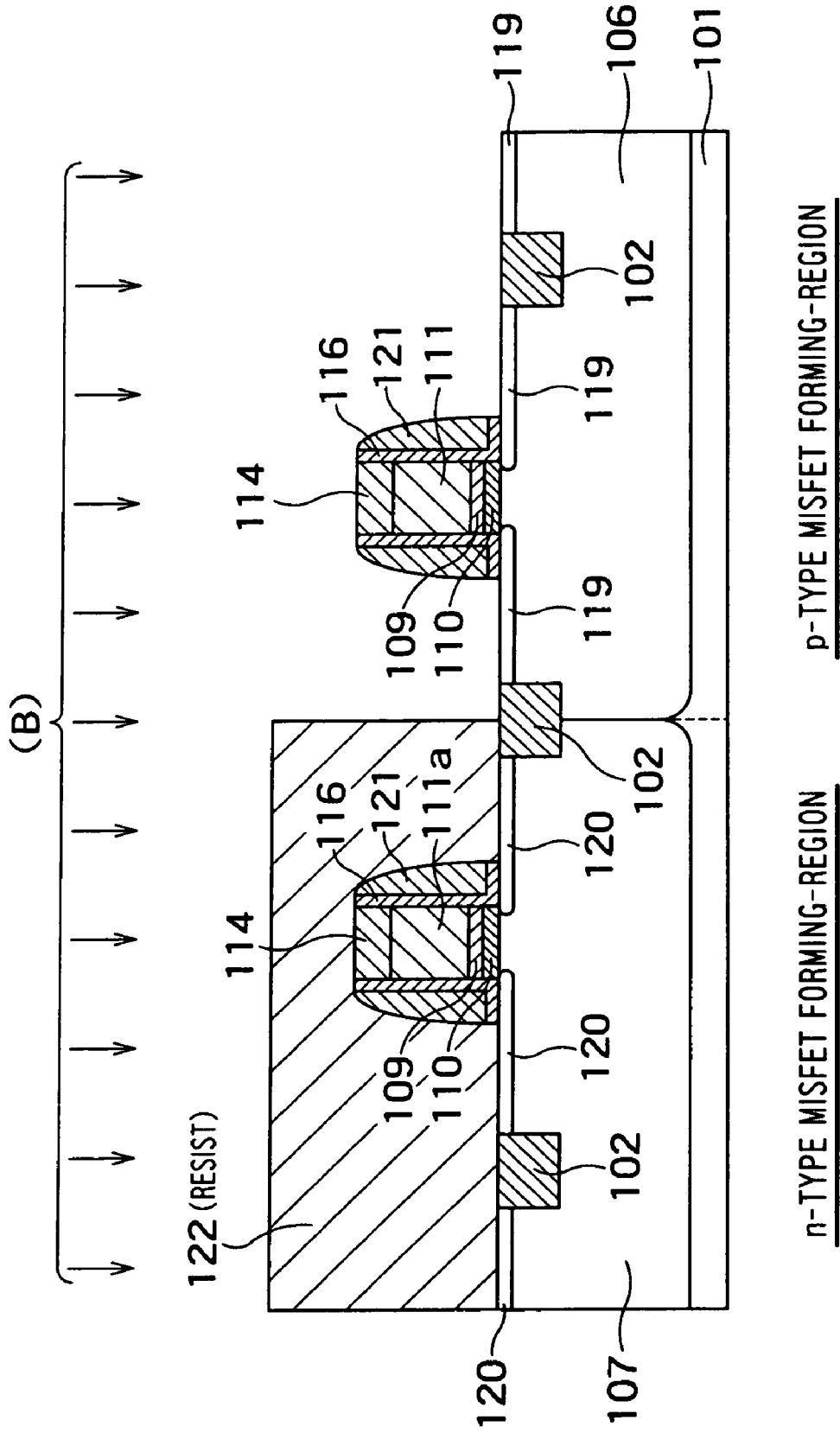
FIG. 13 is a sectional view showing a flow of a semiconductor device manufacturing method following FIG. 12.

Next, as shown in FIG. 13, an n-type MISFET region is covered with a photoresist 122 using photolithography. A p-type impurity (for example, boron) is ion implanted in the p-type MISFET forming-region by using the photoresist 122, the mask material 114, and the spacers 116, 121 as a mask. Although not shown, a p-type MISFET region is covered with a photoresist, and an n-type impurity (for example, arsenic or phosphorus) is ion implanted in the n-type MISFET forming region.

Figure 14:
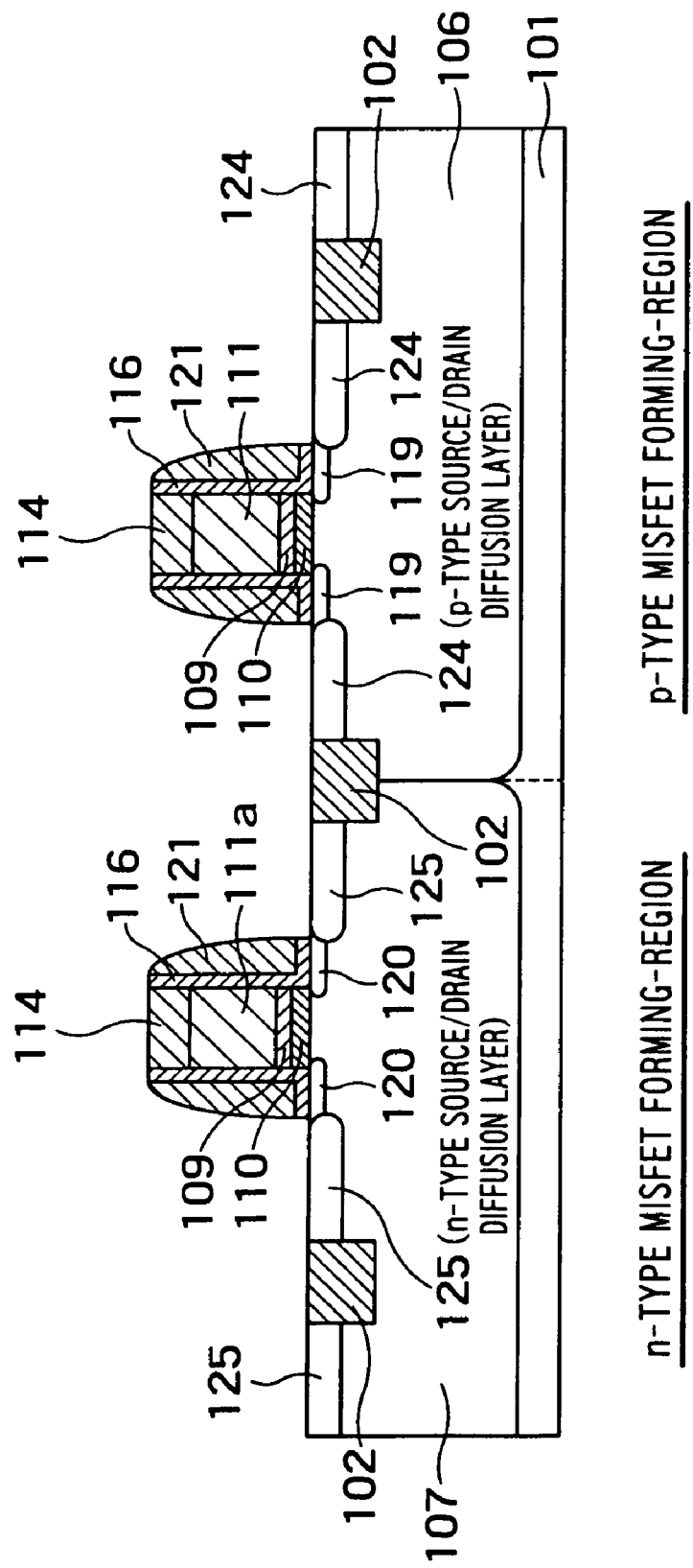
FIG. 14 is a sectional view showing a flow of a semiconductor device manufacturing method following FIG. 13.

After the photoresist is removed, the silicon substrate 101 is subjected to a heat treatment and the impurities are activated, thereby a p-type source/drain diffusion layer 124 and an n-type source/drain diffusion layer 125 are formed as shown in FIG. 14.

In the embodiment, although the ion implantation to the extension diffusion layer is carried out before the ion implantation to the source/drain diffusion layers, the extension diffusion layer may be formed after the source/drain diffusion layers are formed. In this case, after the side wall spacer is removed once, the extension diffusion layer is formed, and then the side wall spacer is formed.

Figure 15:
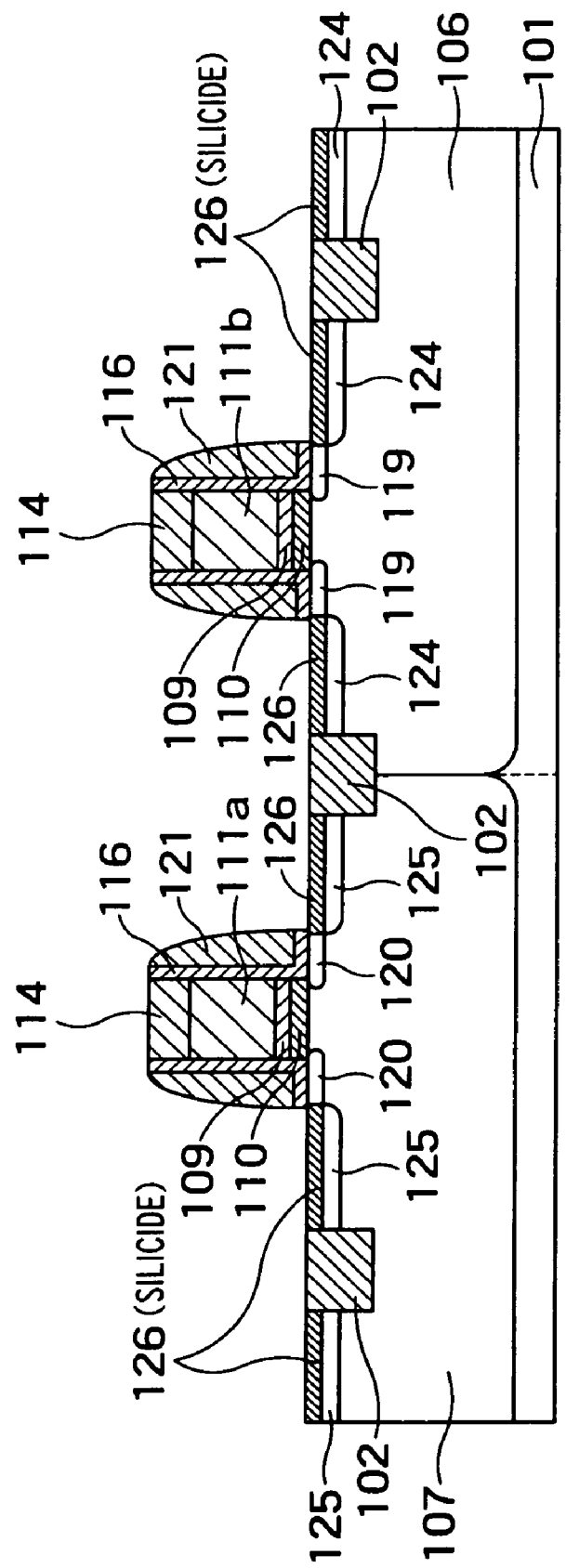
FIG. 15 is a sectional view showing a flow of a semiconductor device manufacturing method following FIG. 14.

Next, a nickel film and a titanium nitride film are deposited on the silicon substrate 101. Subsequently, as shown in FIG. 15, a nickel silicide 126 is formed on the source/drain diffusion layers 124, 125 by subjecting the silicon substrate 101 to a heat treatment. Further, the titanium nitride film and the unreacted nickel film are removed.

Figure 16:
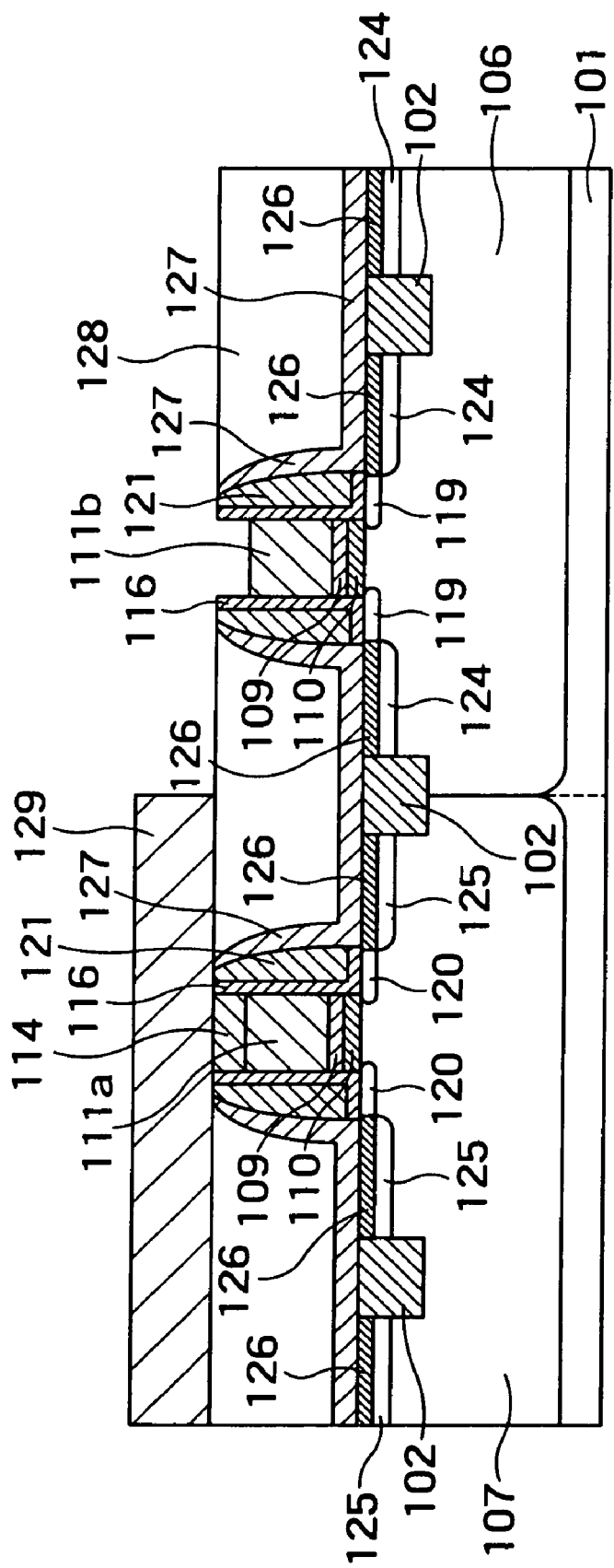
FIG. 16 is a sectional view showing a flow of a semiconductor device manufacturing method following FIG. 15.

Next, an interlayer insulation film 128 composed of a silicon nitride film 127 and a silicon oxide film are deposited on the gate electrode materials 111a, 111b and on the silicon substrate 101 as a second mask material by using a CVD process. The silicon nitride film 127 and the interlayer insulation film 128 also act as an etching stopper in a subsequent process. The silicon nitride film 127 and the interlayer insulation film 128 are polished until the mask material 114 is exposed by using CMP (Chemical-Mechanical Polishing). The n-type MISFET forming region is covered with a photoresist 129 by using photolithography. Subsequently, the mask material 114 on the gate electrode material 111b is etched by using the photoresist 129, the silicon nitride film 127, and the interlayer insulation film 128 as a mask. With these processes, a structure shown in FIG. 16 is obtained.

Figure 17:
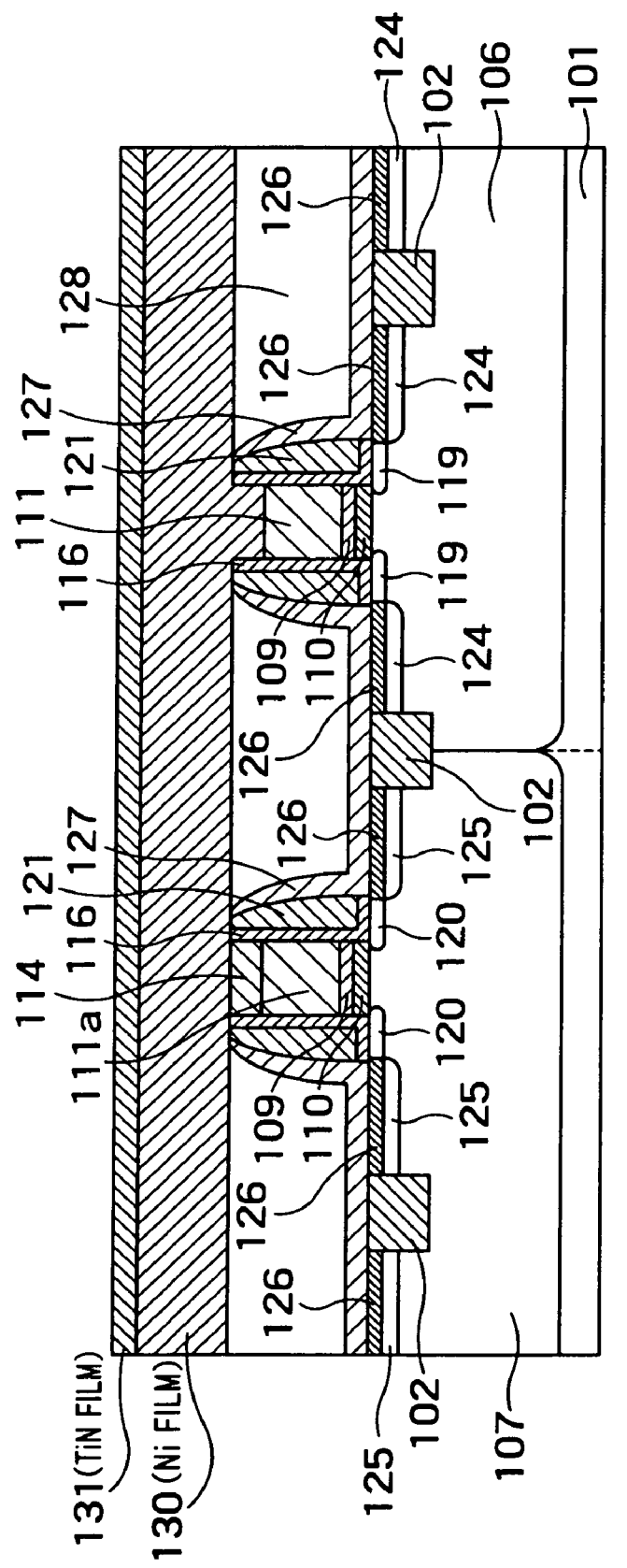
FIG. 17 is a sectional view showing a flow of a semiconductor device manufacturing method following FIG. 16.

After the photoresist 129 is removed, a nickel film 130 and a titanium nitride (TiN) film 131 are deposited on the gate electrode material 111b as a first metal film as shown in FIG. 17. At the time, the thickness of the nickel film 130 is 1.1 to 1.2 times that of the gate electrode material 111b.

Figure 18:
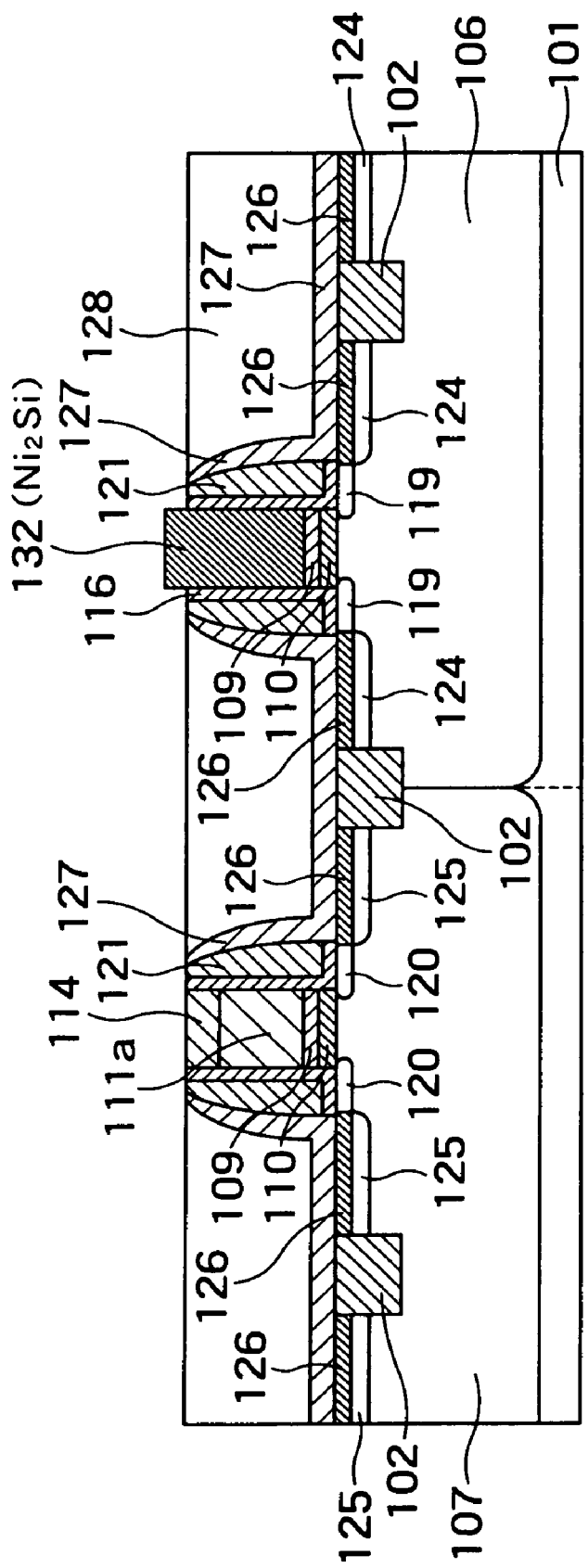
FIG. 18 is a sectional view showing a flow of a semiconductor device manufacturing method following FIG. 17.

Next, a heat treatment is carried out at 350° C. to 450° C. to react the gate electrode material 111b with the nickel film 130. At the time, the gate electrode material 111b is fully silicided until it is made to a $Ni_2Si$ film 132 (first silicidation). Thereafter, the nickel film 130 and the titanium nitride film 131 that are not reacted are removed. With these processes, a structure shown in FIG. 18 is obtained.

The ratio of nickel content in the gate electrode material 111b can be controlled by the thickness ratio of the nickel film 130 and the gate electrode material 111b. Ordinarily, when the thickness of a silicide metal film is 0.5 to 0.7 times that of a polysilicon gate electrode, the polysilicon gate electrode is silicided to NiSi. When the thickness of the silicide metal film is 1.1 to 1.2 times that of the polysilicon gate electrode, the polysilicon gate electrode is silicided to $Ni_2Si$. Further, when the thickness of the silicide metal film is 1.5 to 2 times that of the polysilicon gate electrode, the polysilicon gate electrode is silicide to $Ni_3Si$. Accordingly, the gate electrode material 111b is silicided to a $Ni_2Si$ film 132 by the first silicidation.

Figure 19:
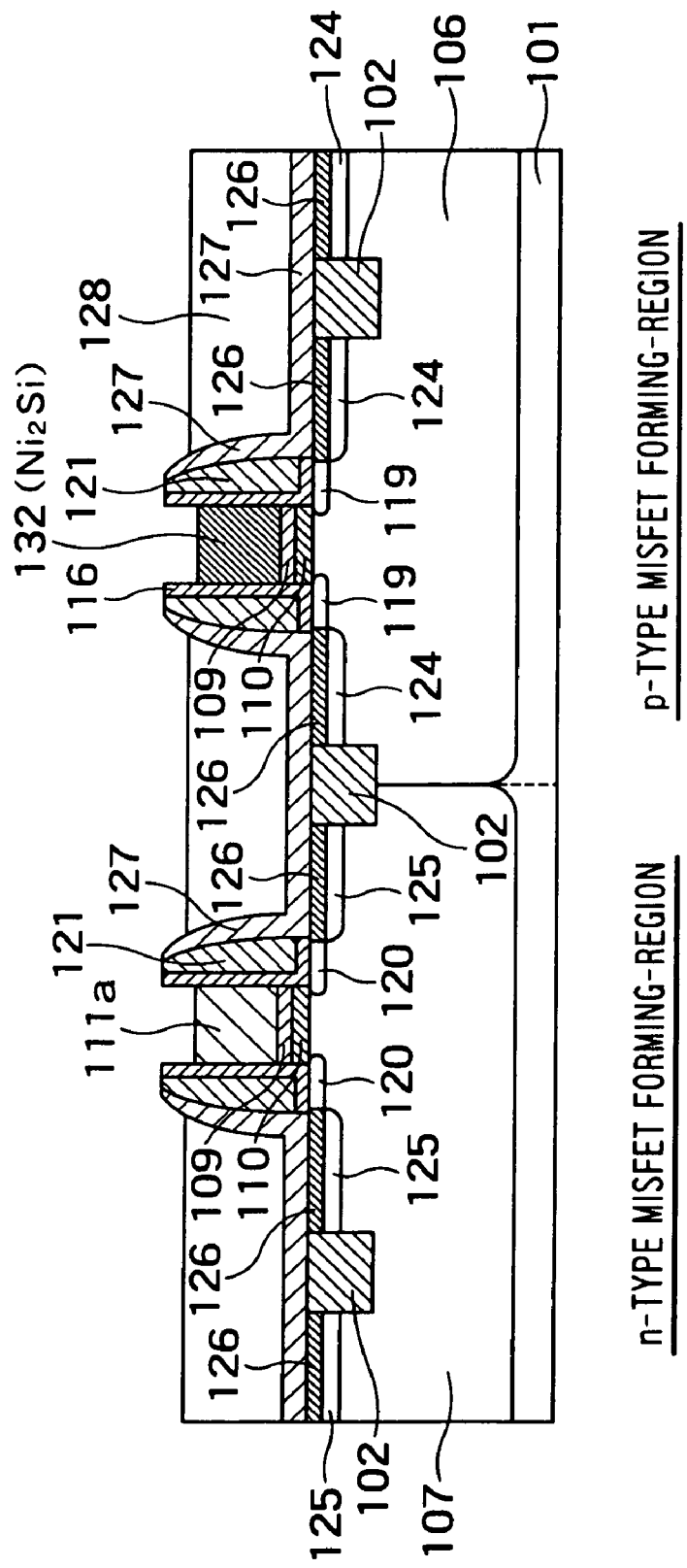
FIG. 19 is a sectional view showing a flow of a semiconductor device manufacturing method following FIG. 18.

Next, as shown in FIG. 19, the upper surface of the gate electrode material 111a is exposed by removing the mask material 114 on the gate electrode 111a. At the time, the interlayer insulation film 128 and the $Ni_2Si$ film 132 are also etched and the surfaces thereof somewhat retreat.

Figure 20:
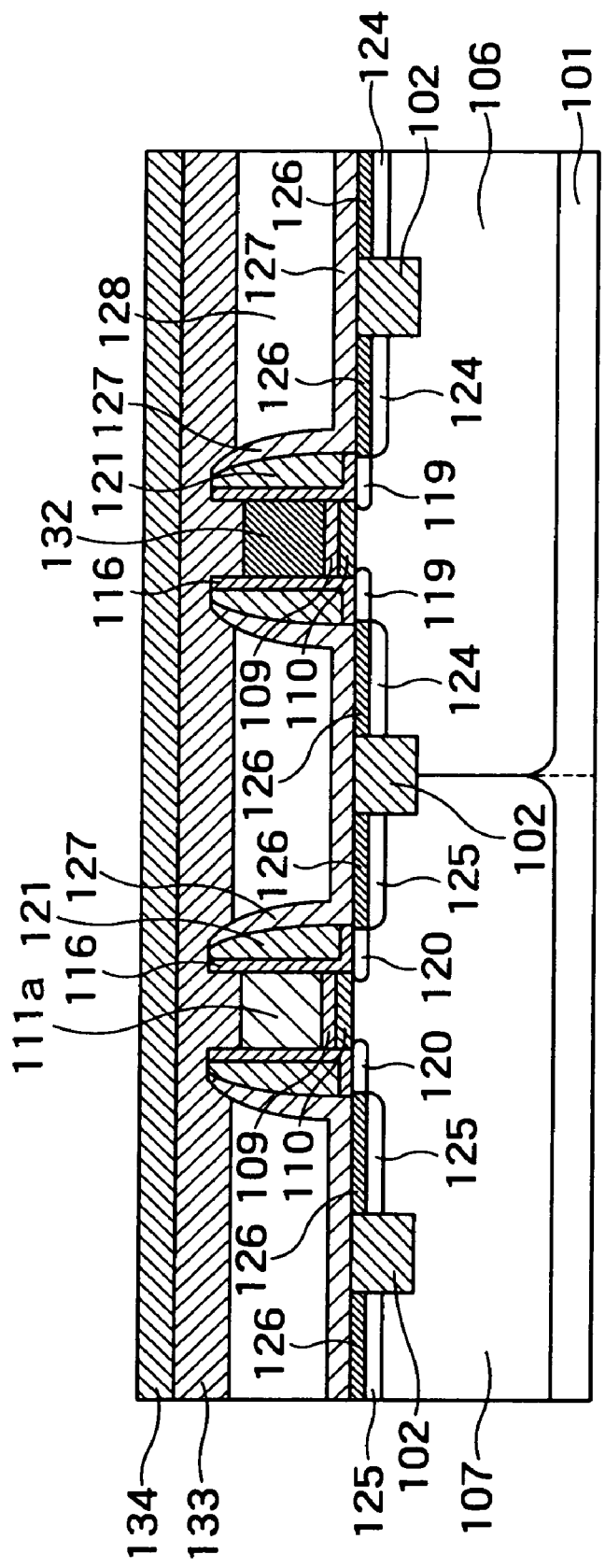
FIG. 20 is a sectional view showing a flow of a semiconductor device manufacturing method following FIG. 19.

Next, as shown in FIG. 20, a nickel film 133 and a titanium nitride (TiN) film 134 are deposited on the respective gate electrode materials 111a and 132 of the p-type MISFET and the n-type MISFET as a second metal film. At the time, the thickness of the nickel film 133 is 0.5 to 0.7 time that of the gate electrode material 111a.

Figure 21:
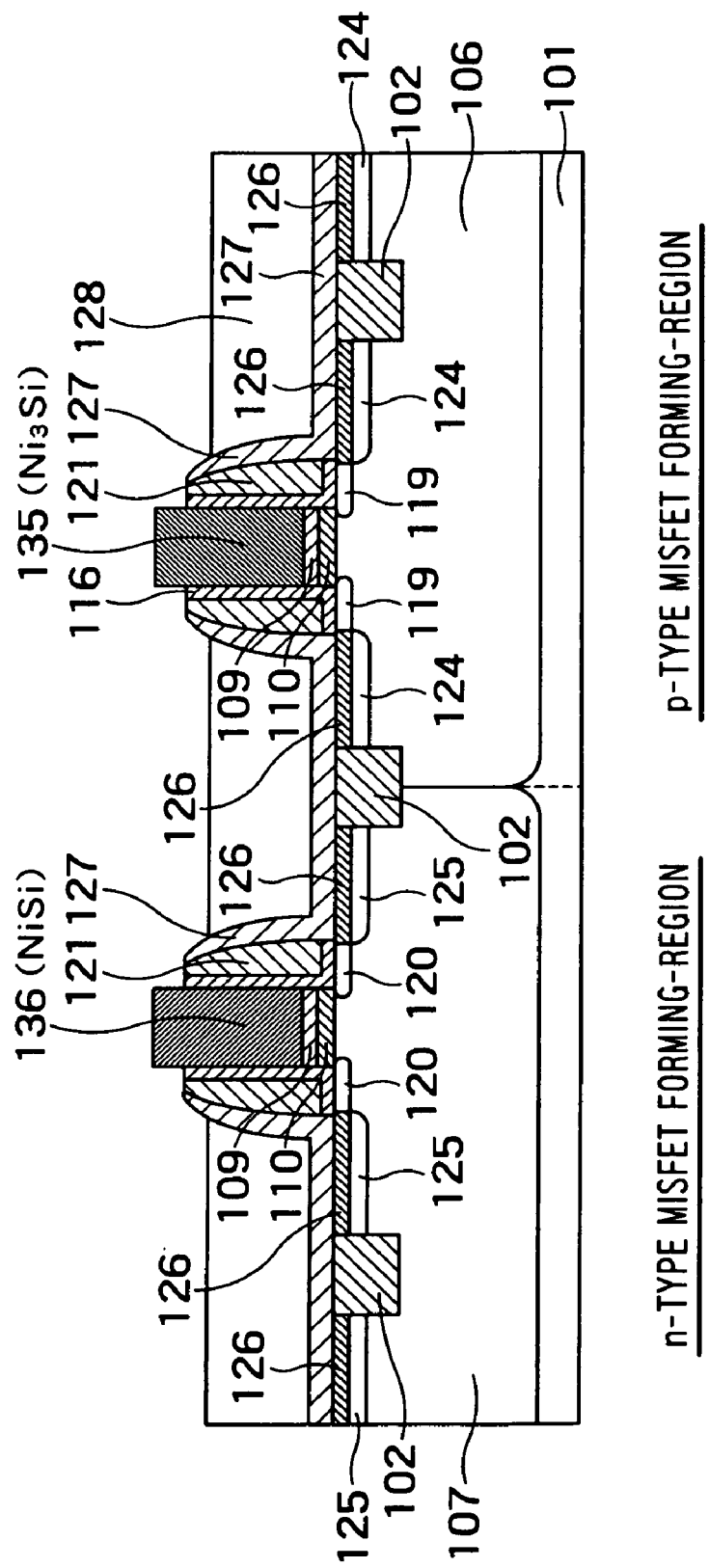
FIG. 21 is a sectional view showing a flow of a semiconductor device manufacturing method following FIG. 20.

Next, a heat treatment is carried out at 350° C. to 450° C. to thereby react the gate electrodes 111a, 132 with the nickel film 130. At the time, the gate electrode material 111b is fully silicided until it is made to a NiSi film 136 as well as the gate electrode material 132 is full-silicided until it is made to a $Ni_3Si$ film 135 (second silicidation). As described above, the ratio of nickel content in the gate electrode material 111a can be controlled by the thickness ratio of the nickel film 133 and the gate electrode material 111a. Thereafter, the nickel film 133 and the TiN film 134 that are not reacted are removed. With these processes, a structure shown in FIG. 21 is obtained. After an interlayer insulation film is deposited and flattened, contacts and wirings (not shown) are formed.

A nickel full silicide (NiSi) that contains antimony (Sb) is formed as the gate electrode of the n-type MISFET, and a nickel full silicide ($Ni_3Si$) is formed as the gate electrode of the p-type MISFET by the above processes. With this arrangement, a CMISFET (Complementary MISFET) having the n-type MISFET and the p-type MISFET each having a proper threshold voltage can be formed.

According to the semiconductor device manufacturing method of the embodiment, the high dielectric material can be used as the gate insulation film as well as the full silicide gate electrodes, whose ratios of nickel content are controlled, can be formed to the n-type MISFET and the p-type MISFET. In the embodiment, the ratio of nickel content in the gate electrode of the p-type MISFET is controlled larger than that of the gate electrode of the n-type MISFET. As a result, the threshold voltages of the n-type MISFET and the p-type MISFET are maintained to proper values. Further, since the high dielectric material is used to the gate insulation film, the embodiment can realize a high degree of carrier movement.

In the embodiment, antimony (Sb) is used as the impurity to be implanted in the gate electrode of the n-type MISFET. However, arsenic (As) and phosphorus (P) may be used in place of antimony.

Modification of First Embodiment

In the first embodiment, the nickel full silicide composed of $Ni_3Si$ is formed as the gate electrode of the p-type MISFET.

In the modification, a nickel full silicide composed of $Ni_2Si$ is formed as a gate electrode of a p-type MISFET. The thickness of a nickel film 130 as a metal film is made to 0.5 to 0.7 times that of a gate electrode material 111b so that the gate electrode of the p-type MISFET is silicided to $Ni_2Si$. Accordingly, a gate electrode material 111b is full-silicided to a NiSi film by the first silicidation.

Thereafter, second silicidation is carried out likewise the first embodiment, thereby a gate electrode of an n-type MISFET is composed of a nickel silicide composed of NiSi, and the gate electrode of the p-type MISFET is composed of a nickel silicide composed of $Ni_2Si$.

The other processes of the modification are the same as those of the first embodiment. Also in the modification, the ratio of nickel content in the gate electrode of the p-type MISFET is controlled larger than that of the gate electrode the n-type MISFET. Accordingly, the modification can obtain the same advantage as the first embodiment.

Second Embodiment

FIGS. 22 to 25 are sectional views showing a semiconductor device manufacturing method according to a second embodiment of the present invention. In the second embodiment, the ratio of nickel content in a gate electrode of a p-type MISFET is controlled by changing the thickness of a gate electrode material 111b thereof.

Figure 22:
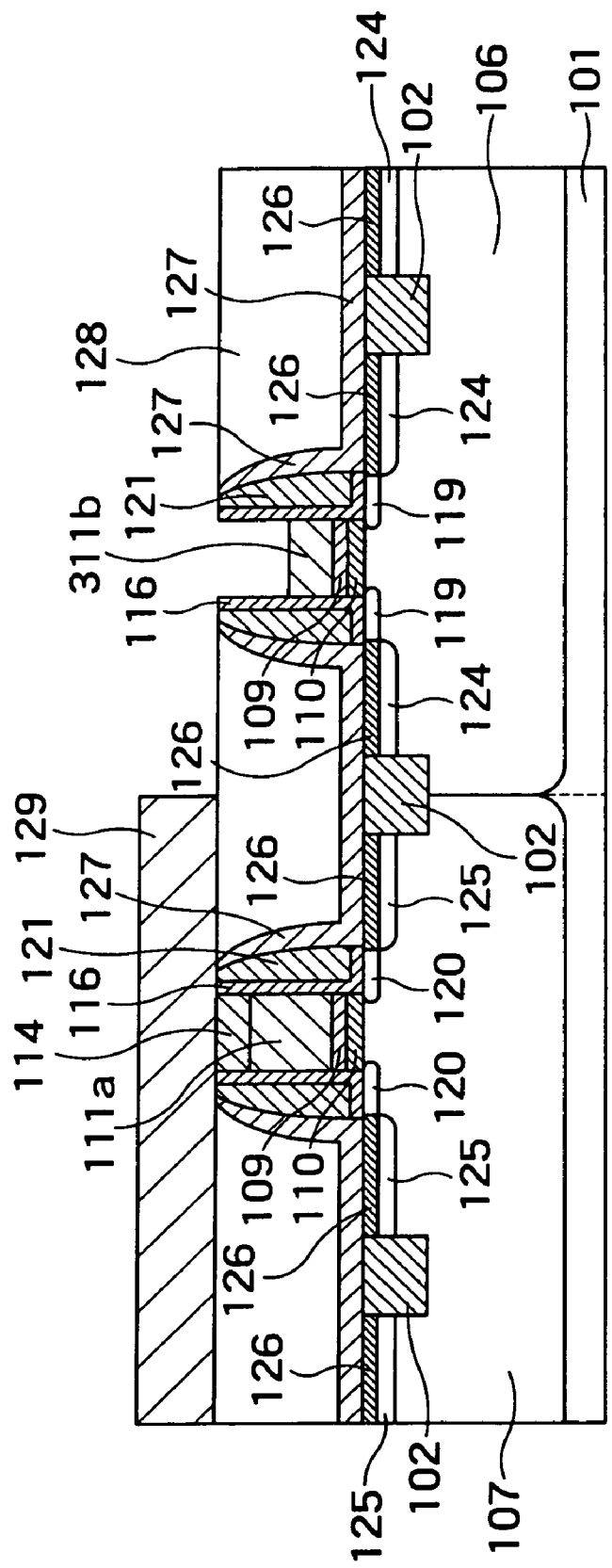
FIG. 22 is a sectional view showing a semiconductor device manufacturing method according to a second embodiment.

In the second embodiment, the processes shown in FIGS. 1 to 16 are carried out in the same manner as in the first embodiment. Thereafter, a gate electrode material 111b is etched as shown in FIG. 22. The thickness of a gate electrode material 311b is made to 0.3 to 0.5 times that of a gate electrode 111a after the etching is carried out.

Figure 23:
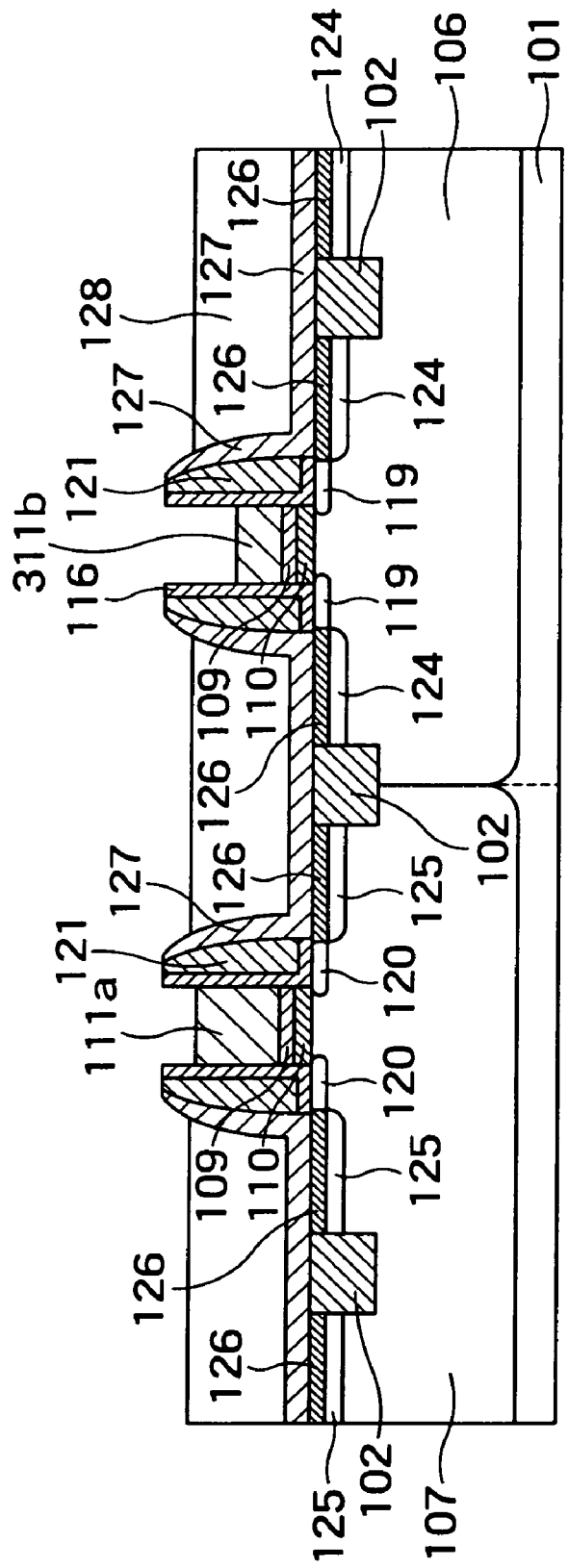
FIG. 23 is a sectional view showing a flow of a semiconductor device manufacturing method following FIG. 22.

After a resist 129 is removed, a mask material 114 on a gate electrode 111a is removed as shown in FIG. 23.

Figure 24:
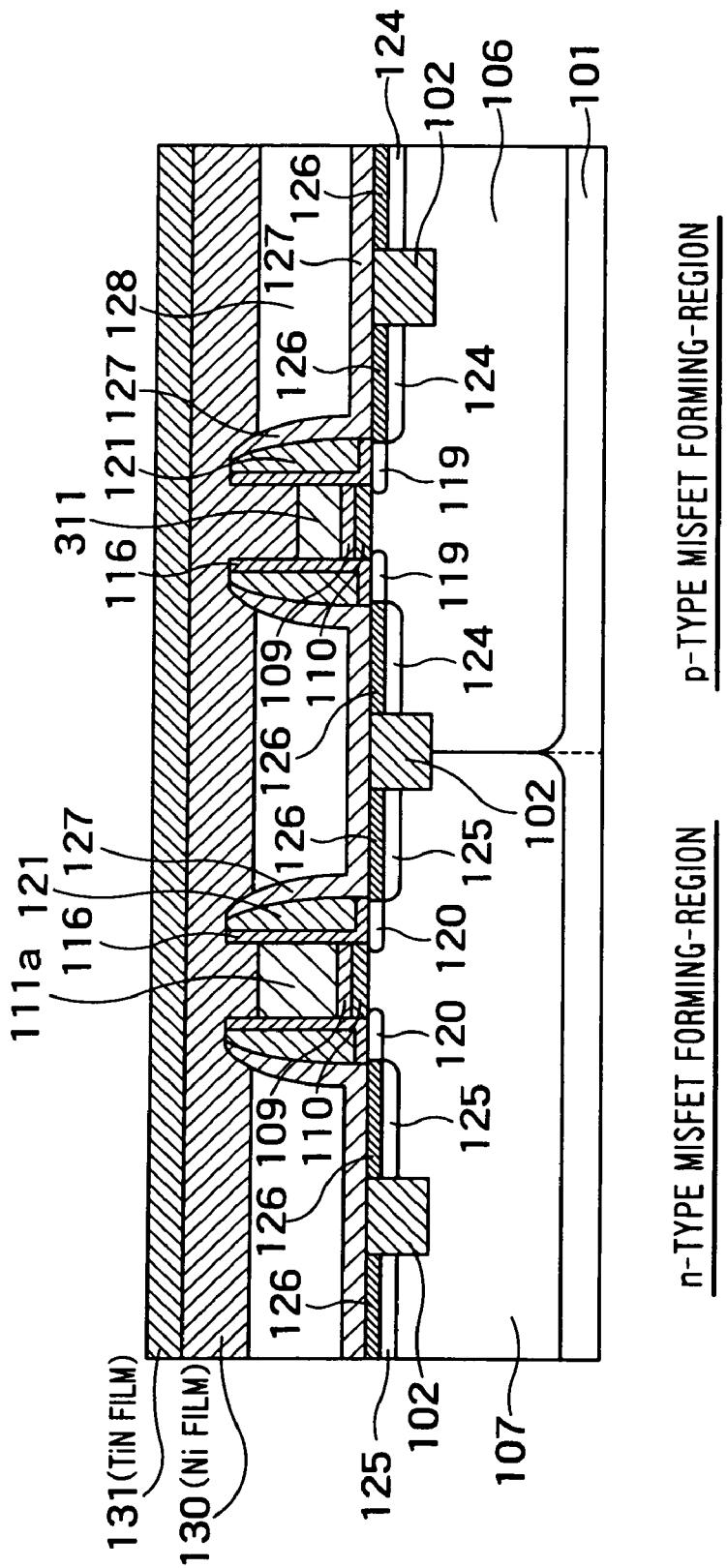
FIG. 24 is a sectional view showing a flow of a semiconductor device manufacturing method following FIG. 23.

Next, as shown in FIG. 24, a nickel film 130 and a titanium nitride (TiN) film 131 are deposited on the gate electrode materials 111a and 311b as a metal material. At the time, the thickness of the nickel film 130 is 0.5 to 0.6 times that of the gate electrode 111a and 1.1 to 1.2 times that the gate electrode material 311b.

Figure 25:
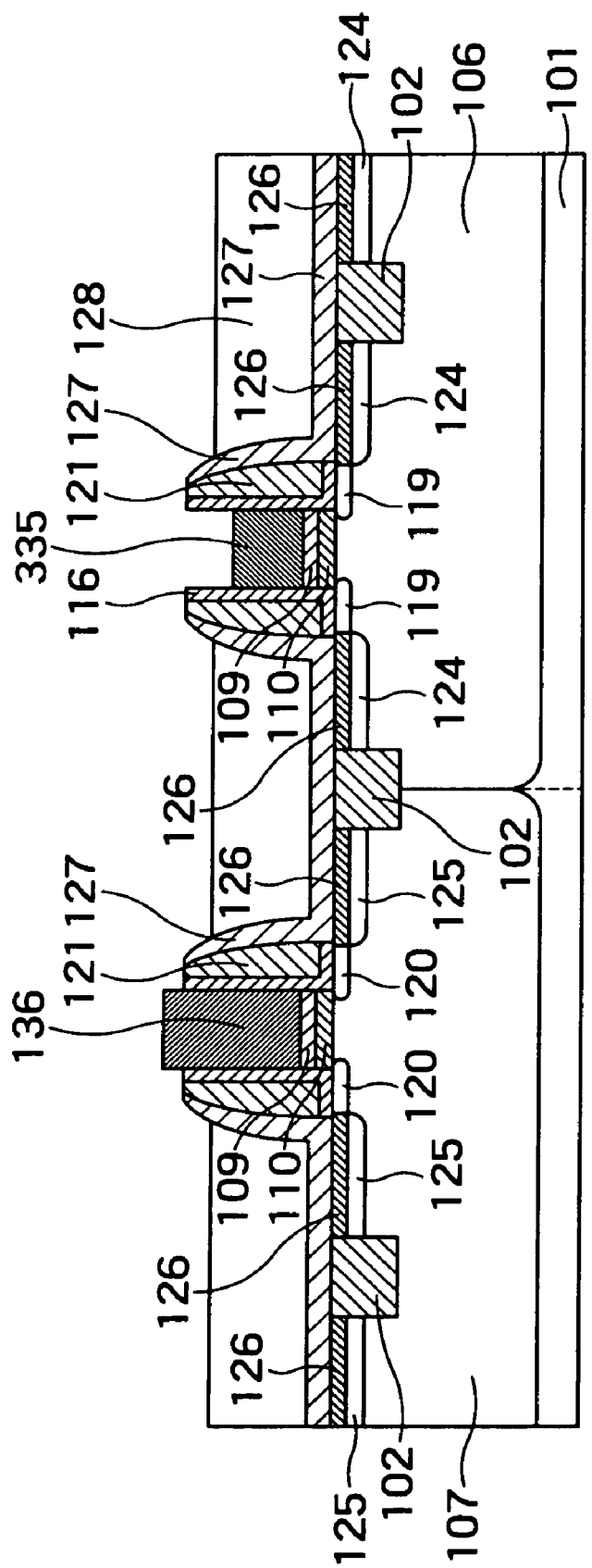
FIG. 25 is a sectional view showing a flow of a semiconductor device manufacturing method following FIG. 24.

Next, a heat treatment is carried out at 350° C. to 450° C. to thereby react the gate electrode materials 111a, 311b with the nickel film 130. At the time, the gate electrode material 111a is full-silicided to a NiSi film 132, and the gate electrode material 311b is full-silicided to a $Ni_2Si$ film 335. Thereafter, the nickel film 130 and the titanium nitride film 131 that are not reacted are removed. With these processes, a structure shown in FIG. 25 is obtained. After an interlayer insulation film is deposited and flattened, contacts and wirings (not shown) are formed.

In the second embodiment, the ratios of nickel content in the gate electrodes are controlled by the thicknesses thereof. Accordingly, the respective gate electrodes of the p-type MIS and the n-type MIS, which have a different ratio of nickel content, are silicided by carrying out the same process only once. As a result, the manufacturing processes of the second embodiment can be made shorter than those of the first embodiment. Further, the second embodiment has even the advantage of the first embodiment.

Modification of Second Embodiment

In the second embodiment, the nickel full silicide composed of $Ni_2Si$ is formed as the gate electrode of the p-type MISFET. In the modification, a nickel full silicide composed of $Ni_3Si$ is formed as a gate electrode of a p-type MISFET. The thickness of a gate electrode material 311b is made to 0.2 to 0.3 times that of a gate electrode material 111a so that the gate electrode of the p-type MISFET is silicided to $Ni_3Si$. The thickness of a silicide metal film is made to 0.5 to 0.6 times that of a gate electrode 111a. With these processes, the gate electrode material 311b is full-silicided to a $Ni_3Si$ film, and the gate electrode material 111a is full-silicided to a NiSi film.

The other processes of the modification are the same as those of the second embodiment. Also in the modification, the ratios of nickel content in the gate electrodes are controlled by the thicknesses thereof. Accordingly, the respective gate electrodes of the p-type MIS and the n-type MIS, which have a different ratio of nickel content, are made to the silicides by carrying out the same process only once. As a result, the modification can obtain the same advantage as the second embodiment.

In the embodiments described above, the gate electrode materials are made to the silicides in a state that the titanium nitride film 131 is disposed on the nickel film 130. The TiN film 131 improves the surface morphology of the nickel silicide as a cap film as well as suppresses invasion of nickel from a gate side wall portion. However, the silicidation can be also carried out without using the TiN film 131 by adjusting silicidation temperature and adjusting silicidation time and by using atmospheric heating and the like in place of heating by lamp. Further, other materials may be used as the cap film in place of the TiN film.

In the above embodiments, the nickel rich silicide having a composition of $Ni_2Si$ or $Ni_3Si$ is used as the gate electrode of the p-type MISFET. However, it is sufficient that the number of Ni atoms is larger than the number of Si atoms in the composition of the gate electrode of the p-type MISFET. For example, a nickel rich silicide having a composition of $Ni_5Si_3$ and the like may be also applied to the embodiments as the gate electrode of the p-type MISFET. In this case, it is necessary to adjust the threshold voltage by ion implantation in a channel and the like.

It is sufficient in the full silicidation that the overall gate electrodes are substantially made to the silicides even if polysilicon somewhat remains. Further, it is sufficient that the portion of the gate electrode of the p-type MISFET in contact with the gate insulation film is made of a nickel rich silicide. Accordingly, the gate electrode may be composed of a laminated structure having a conductive material other than silicide on the upper portion thereof. With this arrangement, the resistance of the gate electrode can be more reduced.

What is claimed is:
1. A semiconductor device comprising:
a semiconductor substrate;
a gate insulation film formed on the semiconductor substrate;
a silicide gate electrode of an n-type MISFET formed on the gate insulation film;
a silicide gate electrode of a p-type MISFET formed on the gate insulation film and having a thickness smaller than that of the silicide gate electrode of the n-type MISFET, the silicide gate electrode of the p-type MISFET being fully-silicided, the silicide gate electrode of the n-type MISFET being fully-silicided; and
spacers and sidewalls provided on side surfaces of each of the silicide gate electrode of the n-type MISFET and the p-type MISFET, wherein
a material of a metal in the silicide gate electrode of the p-type MISFET is the same as a material of a metal in the silicide gate electrode of the n-type MISFET, a top surface of the silicide gate electrode of the n-type MISFET is higher than top surfaces of the spacers and sidewalls, and a top surface of the silicide gate electrode of the p-type MISFET is lower than top surfaces of the spacers and sidewalls.

2. The device according to claim 1, wherein the silicide gate electrode of the p-type MISFET has a composition of $Ni_xSi_y$, wherein x>y, and the silicide gate electrode of the n-type MISFET has a composition of NiSi.

3. The device according to claim 1, wherein the gate insulation film includes a HfSiON film and a silicon oxide film.

* * * * *